United States Patent [19]
Waechter et al.

[11] Patent Number: 5,780,858
[45] Date of Patent: Jul. 14, 1998

[54] ELECTROMAGNETIC RADIATION IMAGING DEVICE USING DUAL GATE THIN FILM TRANSISTORS

[75] Inventors: David Waechter, Brampton; Surendra Singh, Waterloo, both of Canada

[73] Assignee: Litton Systems Canada Limited, Ontario, Canada

[21] Appl. No.: 693,184

[22] PCT Filed: Feb. 11, 1994

[86] PCT No.: PCT/CA94/00077

§ 371 Date: Oct. 4, 1996

§ 102(e) Date: Oct. 4, 1996

[87] PCT Pub. No.: WO95/22176

PCT Pub. Date: Aug. 17, 1995

[51] Int. Cl.$^6$ .................. H01L 27/146; G01T 1/24
[52] U.S. Cl. .................. 250/370.09; 250/370.08; 250/208.1
[58] Field of Search .................. 250/208.1, 370.09, 250/370.11, 370.08

[56] References Cited

U.S. PATENT DOCUMENTS

| | | | |
|---|---|---|---|
| 4,592,029 | 5/1986 | Altmann et al. | 250/208.1 |
| 4,679,068 | 7/1987 | Lillquist et al. | 250/332 |

Primary Examiner—Edward J. Glick
Attorney, Agent, or Firm—Dilworth & Barrese

[57] ABSTRACT

An electromagnetic radiation imaging device comprising an energy absorbing layer overlying an array of thin film transistors (TFTs), each of the thin film transistors incorporates a dual gate. The lower gate provides row selection, while the upper gate of the same device modulates current conducted by the transistor. By utilizing dual gates, a reduction in the number of transistors is achieved over prior art imaging devices, thereby increasing production yield. Furthermore, the use of dual gate transistors provides increased versatility in choosing the bias point of the transistors.

13 Claims, 6 Drawing Sheets ic radiation
ELECTROMAGNETIC RADIATION IMAGING DEVICE USING DUAL GATE THIN FILM TRANSISTORS

FIELD OF THE INVENTION

This invention relates in general to opto-electronic devices, and more particularly to an electromagnetic radiation imaging device incorporating an array of dual gate thin film transistors.

BACKGROUND OF THE INVENTION

The use of two-dimensional arrays of thin film transistors for radiation detection is known in the art. One prior art X-ray imaging detector has been developed at the University of Michigan, as described in L. E. Antonuk, J. Boudry, W. Huang, D. L. McShan, E. J. Morton, J. Yorkston, M. J. Longo, and R. A. Street, Multi-Element Amorphous Silicon Detector Array (MASDA), MED PHYS 19, 1455 (1992). In this prior art detector, a scintillating material (e.g. phosphor screen or CsI) converts X-rays directly into light. The light then impinges on an array of a-Si:H photodiodes, which produce charge in proportion to the light intensity. The generated charge is stored on a capacitor and is read out through a thin film transistor (TFT) as each line is addressed.

Another prior art detector has been developed by researchers at the University of Toronto in which X-rays are converted directly to charge. This system is described in W. Zhao and J. S. Rowlands, Selenium Active Matrix Universal Read-out Array Imager (SAMURAI), Medical Imaging VII: Physics of Medical Imaging SPIE (1993). Both the prior art MASDA and SAMURAI devices require measurement of charge (or integrated current), which is proportional to X-ray intensity, for each addressed row of the array.

Instead of directly measuring the charge generated by the radiation, it is known in the art to allow the charge to accumulate on the gate of a field effect transistor and to modulate the current through the channel. This approach takes advantage of the intrinsic amplification function of a field effect transistor and also allows the signal to be measured without necessarily destroying the charge. This prior art approach to radiation detection has been disclosed in U.S. Pat. Nos. 5,182,624 and 5,235,195 (Tran et al).

A modified version of this approach, for video camera use, has also been proposed (see Z-S. Huang and T. Ando, IEEE Transactions on Electronic Devices, ED-37 1432 (1990) and F. Andoh, K. Taketoshi, J. Yamasaki, M. Sugawara, Y. Fujita, K. Mitani, Y. Matuzawa, K. Miyata and S. Araki, Proceedings of IEEE International Solid State Circuits Conference, page 212 (1990)). In this modified version, a three transistor circuit is used at each pixel location. One of the transistors is used for row selection, another is used for modulating the current in proportion to the radiation-induced charge, and third transistor is used to clear the radiation-induced charge when the next row is addressed.

SUMMARY OF THE INVENTION

According to the present invention an electromagnetic radiation imaging detector is provided comprising an energy absorbing layer overlying an array of thin film transistors. Electron-hole pairs (EHPs) are generated in the energy absorbing layer in proportion to the intensity of electromagnetic radiation to which the layer is exposed. A voltage is applied across the absorbing layer for separating the electron-hole pairs. According to the present invention, each of the thin film transistors incorporates a dual gate. The lower gate is used for row selection in the array, and the upper gate is used to collect charge generated by the energy absorbing layer. This charge effectively modulates the current conducted by each thin film transistor so that upon addressing individual rows of pixels, the drain currents from the associated thin film transistors may be measured to provide an accurate reading of the electromagnetic radiation in the vicinity of the pixel.

The composition of the energy absorbing layer is chosen for sensitivity in the desired region of the electromagnetic spectrum. The energy absorbing layer may comprise a single layer material, or a multi-layer stack, as in a PIN photodiode. A list of suitable materials for various spectral regions is disclosed in U.S. Pat. No. 5,235,195 (Tran et al). The energy absorbing layer may be a uniform coating or may be delineated to form isolated devices on each pixel.

According to the preferred embodiment, in addition to the signal modulated thin film transistor, each pixel includes a further transistor which is used to clear the charge on the upper gate through the drain lines when the next row of the array is addressed.

By reducing the number of transistors required for each pixel over the above-discussed prior art systems, significant advantages are enjoyed over the prior art in terms of production yield. Furthermore, the dual gate thin film transistors of the present invention provide greater versatility in the ability to choose the bias point of the signal-modulated transistor. In particular, for pixel arrays which utilize only single gate field effect-transistors, the threshold voltage of all transistors is fixed by the fabrication technology. By way of contrast, the threshold voltage measured with respect to one gate in a dual gate TFT may be altered by changing the bias of the other gate. Thus, according to the present invention it is possible to perform radiation measurements with a single ON state value of the lower gate voltage, or to sweep the lower gate voltage and utilize the most sensitive bias point for each pixel, or the bias point with the most linear response.

BRIEF DESCRIPTION OF THE DRAWINGS

A detailed description of the preferred embodiment is provided herein below with reference to the following drawings in which.

DETAILED DESCRIPTION OF THE PREFERRED EMBODIMENT

Figure 1:
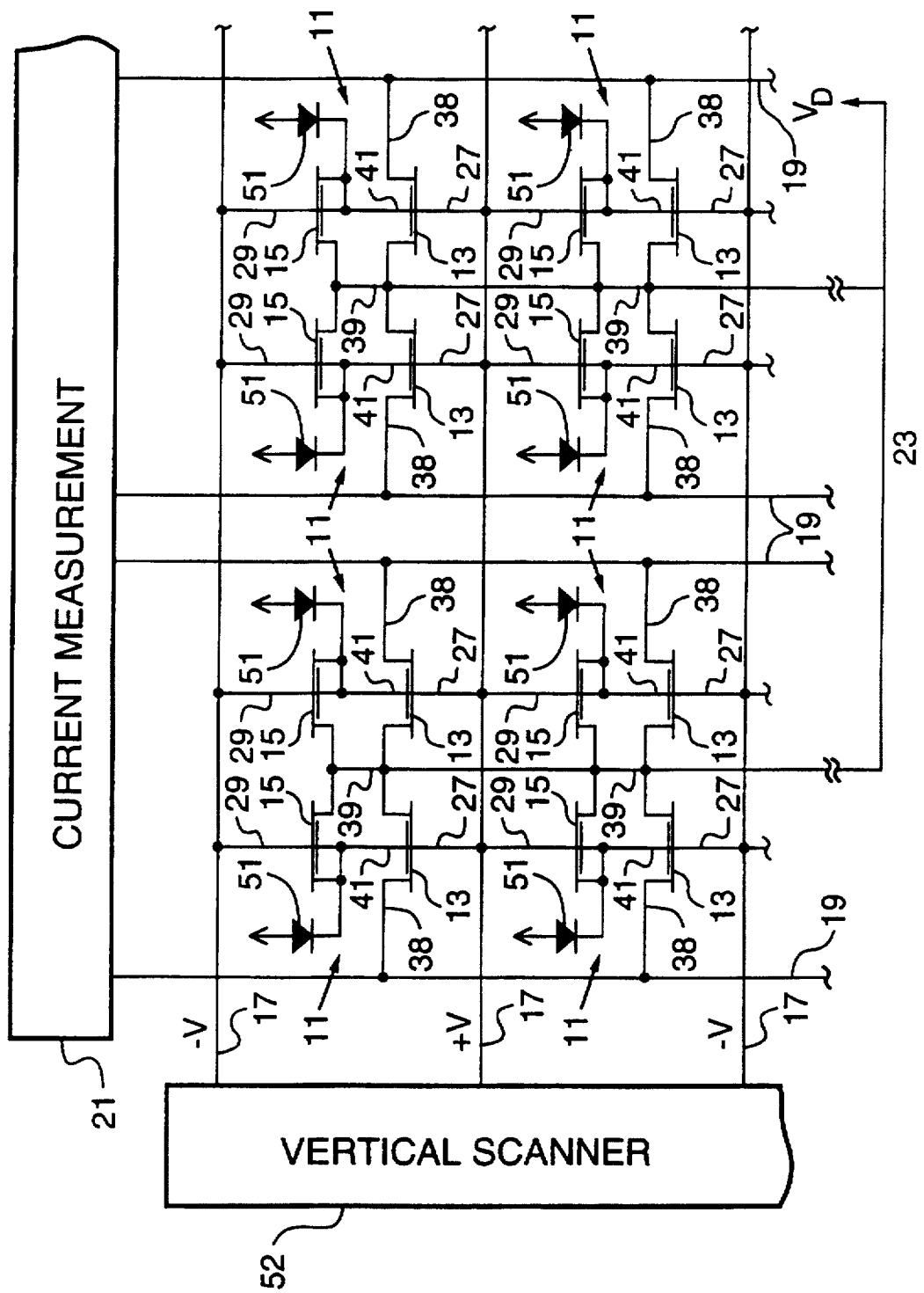
FIG. 1 is a circuit diagram of an electromagnetic radiation imaging device according to the present invention.

Turning to the circuit diagram of FIG. 1, an electromagnetic radiation imaging device is illustrated comprising an array of pixels 11, each comprising a signal modulation transistor 13, a charge clearing transistor 15 and a radiation to charge transducer 51, schematically represented by a photodiode. In the illustrated embodiment, 2 by 4 pixels are shown, although in practice, arrays on the order of 640×480 pixels or greater are contemplated.

Each of the TFTs 13 and 15 is a dual gate transistor comprising respective lower gates 27 and 29, as discussed in greater detail below with reference to FIG. 2–4, and a shared upper gate 41.

The lower gate 27 of each signal modulating TFT 13, is connected to a row select line 17 to which a bottom gate voltage $V_{GB}$ of $V_{ON}$ or $V_{OFF}$ is applied by a vertical scanner 52. In response to application of the $V_{ON}$ signal on a predetermined one of the row select lines 17, the row of transistors 13 connected to that line is enabled. The row of transistors 13 connected to a row select line 17 to which a $V_{OFF}$ voltage is applied, is disabled. Thus, by selectively applying the $V_{ON}$ voltage to successive ones of the row select lines 17, respective rows of the array are enabled. Likewise, the charge clearing transistor 15 for each pixel is enabled immediately following selection of the row to which its associated signal modulating transistor 13 has been selected, for clearing charge on the upper gate 41 as discussed in greater detail below.

Each of the source electrodes 38 of respective ones of signal modulating TFTs 13 are connected to respective data columns 19 which are connected to current measurement devices 21. The drain electrodes 39 of transistors 13 and 15 are connected together and to an output voltage line 23 ($V_D$).

The current measurement devices 21 can be operational amplifiers configured for current measurement, analogue-to-digital converters, or suitable well known current measurement means.

Figure 2:
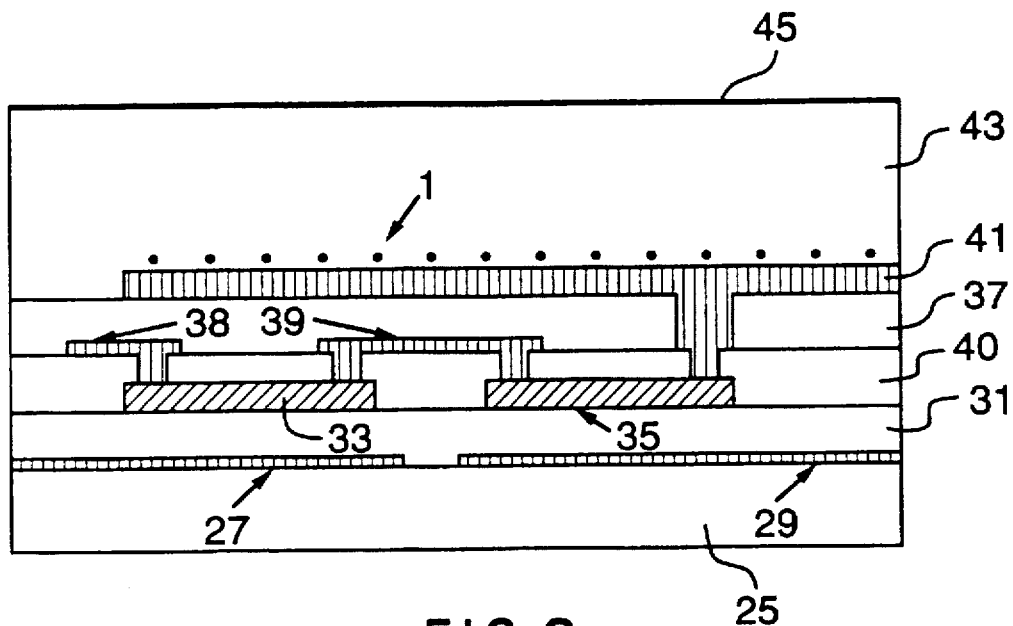
FIG. 2 is a cross-sectional view of a single pixel element of the imaging device of FIG. 1 with top contact implementation, according to a first embodiment of the invention.
Figure 3:
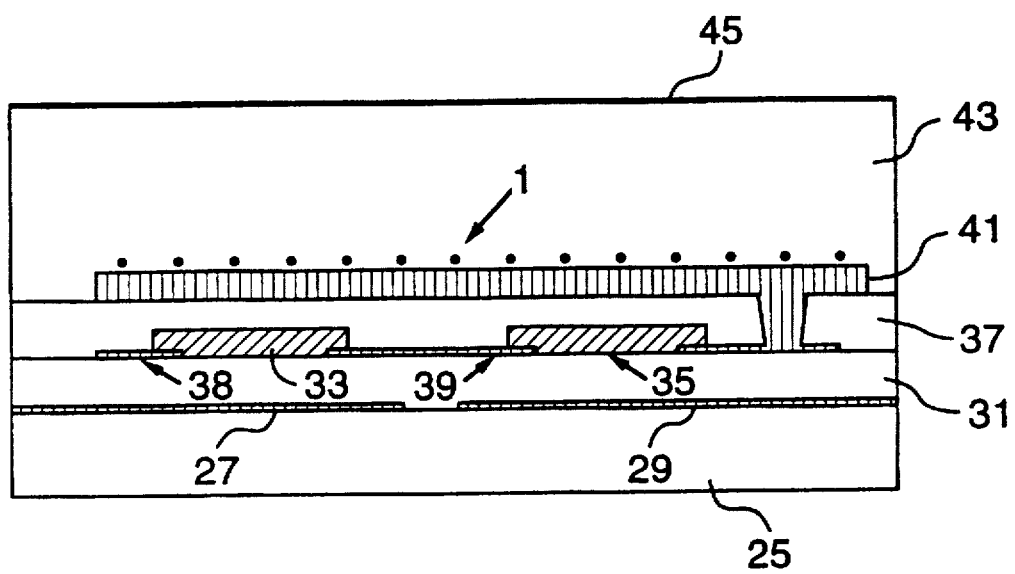
FIG. 3 is a cross-sectional view of a single pixel element of the imaging device of FIG. 1 with bottom contact implementation, according to a second embodiment of the invention.

Turning now to FIGS. 2 and 3, cross sectional views of two embodiments of a single pixel element are shown according to the present invention. The array of transistors 13 and 15 are disposed on a suitable substrate 25 such as glass. Next, the lower gates 27 and 29 are deposited for transistors 13 and 15, respectively. A first insulating layer 31 is deposited over the gate electrodes 27 and 29 and semiconductor channel regions 33 and 35 are created for transistors 13 and 15, respectively, using conventional techniques. A second insulating layer 37 is then deposited on semiconductor channel regions 33 and 35.

According to the embodiment of FIG. 3, source and drain contacts 38 and 39 contact semiconductor channel regions 33 and 35 at the bottom thereof, whereas in the embodiment of FIG. 2, the source and drain contacts 38 and 39 contact the semiconductor channel regions 33 and 35 at the top thereof. In the top contact embodiment of FIG. 2, an additional insulating layer 40 is provided intermediate layers 31 and 37. This insulation layer is optional and may be reduced to zero thickness.

The charge collecting upper gate 41 is deposited over insulating layer 37 and is shared by both transistors 13 and 15.

Next, electromagnetic energy absorbing layer 43 is deposited over the upper gate 41 and a top electrode 45 is deposited on the energy absorbing layer 43. The top electrode 45 must be transparent or semi-transparent in the desired spectral region to be detected. Suitable electrode materials include thin metal films for X-ray detection and indium tin oxide (ITO) for visible light detection.

As discussed above, the composition of the energy absorbing layer 43 must be chosen for sensitivity in the desired region of the electromagnetic spectrum. For example, selenium may be used for X-ray detection, an amorphous silicon PIN stack may be used for visible light detection.

A variety of semi-conductor materials may be used for the regions 33 and 35, including amorphous and polycrystalline silicon, and CdSe.

The contact metalization 38 and 39, insulating layers 31, 37 and 40, and the substrate 25 may be formed using a wide variety of materials or material composites well known in the semiconductor industry.

Figure 4:
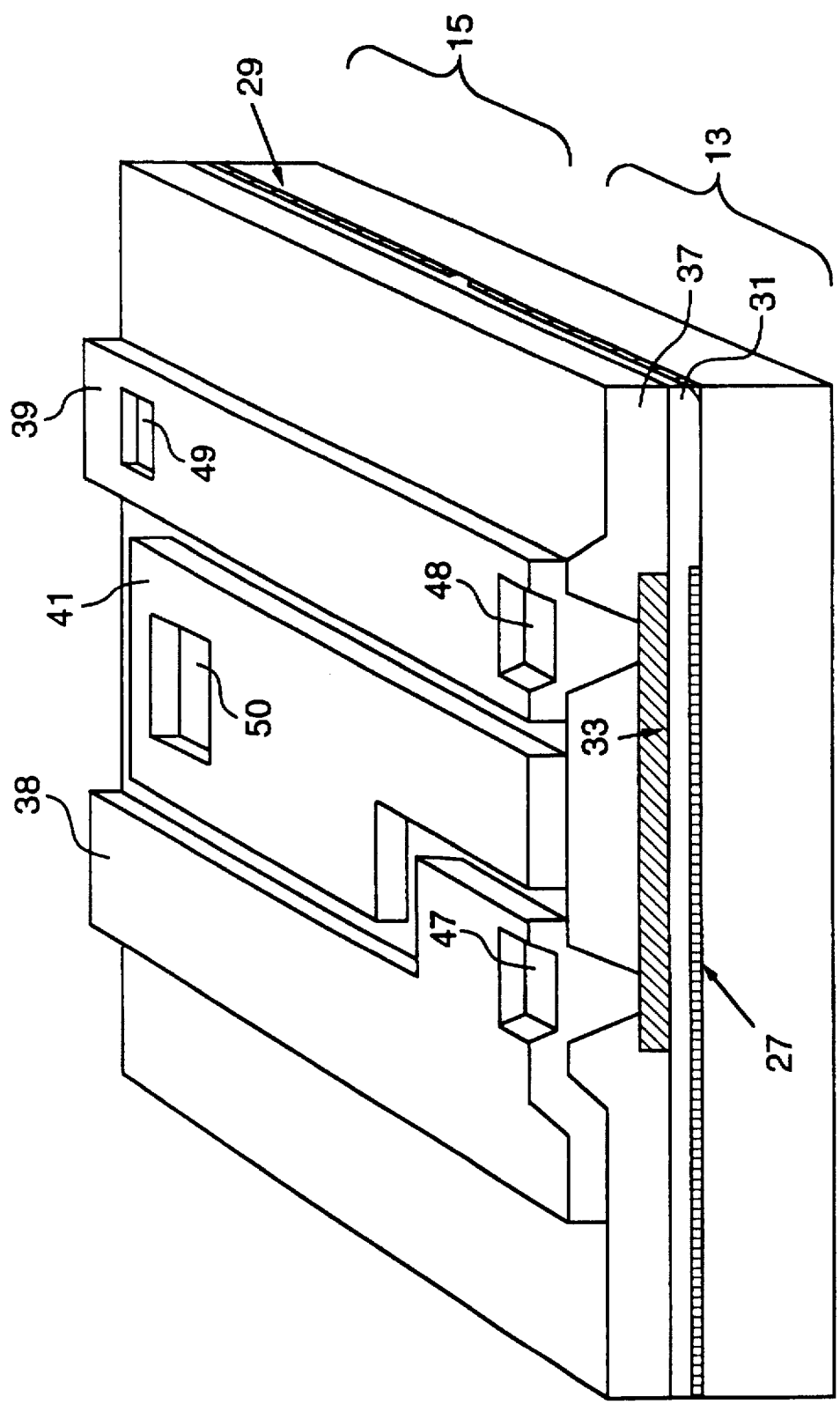
FIG. 4 is a perspective view of a single pixel element (without energy absorbing layer and top electrode) with top gate metal on the same level as source and drain, according to a further embodiment of the invention.

In the embodiment of FIG. 4, the upper gate 41 is shown deposited on the same level as the source line 38 and drain line 39. The energy absorbing layer and high voltage top electrode have been omitted from FIG. 4 for visual clarity. In FIG. 4, contact vias are shown for connecting various electrodes of the thin film transistors, as follows: 47 is a contact via to the source of signal modulating transistor 13; 48 is a contact via to the drain of transistor 13; 49 is a contact via to the drain of charge clearing transistor 15; and 50 is a contact via from the upper gate 41 to the source electrode of transistor 15.

Figure 5:
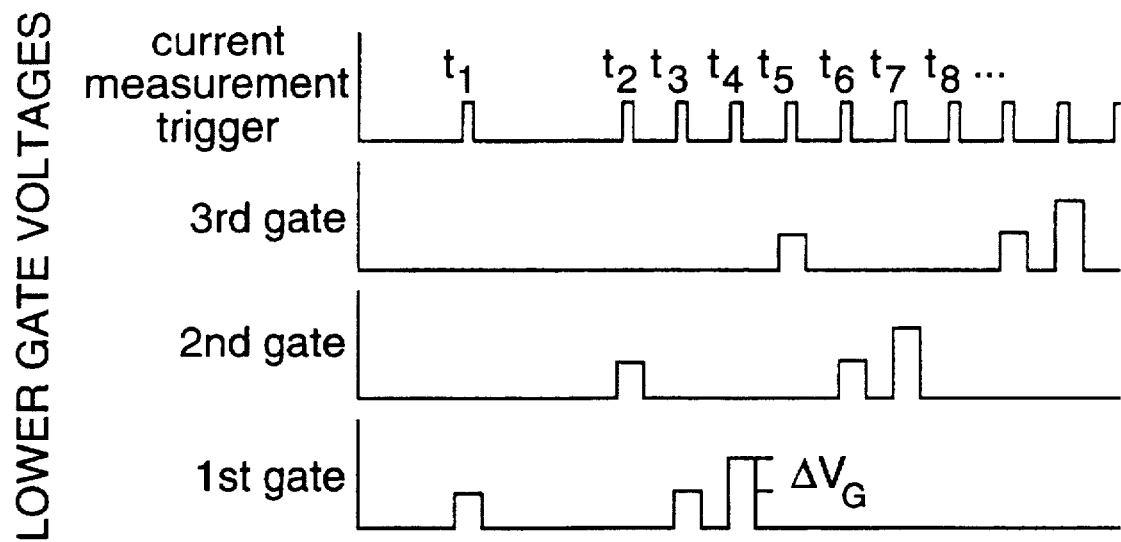
FIG. 5. is a timing diagram for operation of the device of FIGS. 1 to 4.

Turning now to FIG. 5 in combination with FIGS. 1–4, operation of the electromagnetic radiation detector of the present invention is described. The timing diagram of FIG. 5 shows voltages applied to the row select lines 17 of respective rows of the TFT array (FIG. 1). Thus, at time $T_1$, a voltage $V_{ON}$ is applied to the first row of the array for measuring current on respective data columns 19 through respective current measurement devices 21 for the selected row. More particularly, in response to being exposed to electromagnetic radiation, electron-hole pairs (EHPs) are generated in the energy absorbing layer 43. A high voltage applied to top electrode 45 causes charge carriers of one polarity to drift upwardly toward the top electrode and charge carriers of the opposite polarity to be collected on the upper gate 41. Thus, with transistor 13 in the ON state as a result of the $V_{ON}$ voltage being applied to lower gate 27, current conducted between the drain and source of TFT 13 is modulated by the electric field generated as a result of charge collected and stored on upper gate 41. In other words, the deposited charge on gate 41 acts as a gate voltage to modulate the current through semiconductor channel 33.

At time $t_2$, the current flowing in the second row of pixels is measured and the charge stored on upper gate 41 of the first row of transistors is discharged by enabling TFT 15 associated with each such pixel. Thus, transistor 15 is only used to clear the charge from the upper gate 41 after measuring current flowing in the associated transistor 13.

At time $t_3$, the current in the first row of transistors is measured again with signal charge absent from upper gate 41. At time $t_4$, the current in transistors 13 for the first row is measured again with signal charge absent but with an increased lower gate voltage on lower gate 27.

At time $t_5$, the current flowing in TFTs 13 for the third row is measured with signal charge present while the signal charge is cleared from the upper gate 41 in each transistor of the second row. The identical pattern is continued for times $t_6, t_7 \ldots$ etc.

The signal on the first row of transistors, resulting from charge deposited on the top gate 41, can be represented by an equivalent change in the voltage on lower gate 27 ($\Delta V_b$), given by:

$$\frac{\Delta V_b}{I_D(t_1) - I_D(t_3)} = \frac{\Delta V_G}{I_D(t_4) - I_D(t_3)}, \text{ or}$$

$$\Delta V_b = \Delta V_G \left( \frac{I_D(t_1) - I_D(t_3)}{I_D(t_4) - I_D(t_3)} \right)$$

This formula takes into account both the zero signal offset and device-to-device variations in transistor gain assuming that for each device, the gain measured with respect to the top gate 41 is a constant fraction of the gain measured with respect to the lower gate 27. Device-to-device variations which are disproportionate between upper and lower gates cannot be factored out.

Other measurement schemes for data readout are also possible. For example, if the array has little device-to-device gain variation, the $t_4$ measurement can be omitted and the desired signal is simply the difference $I_D(t_1)-I_D(t_3)$.

Another possibility is to drive the selected row with a voltage ramp and use a comparator in the current measurement circuit to identify the lower gate voltage which produces a designated current. This voltage would vary with the inducted potential on the top gate.

Figure 6:
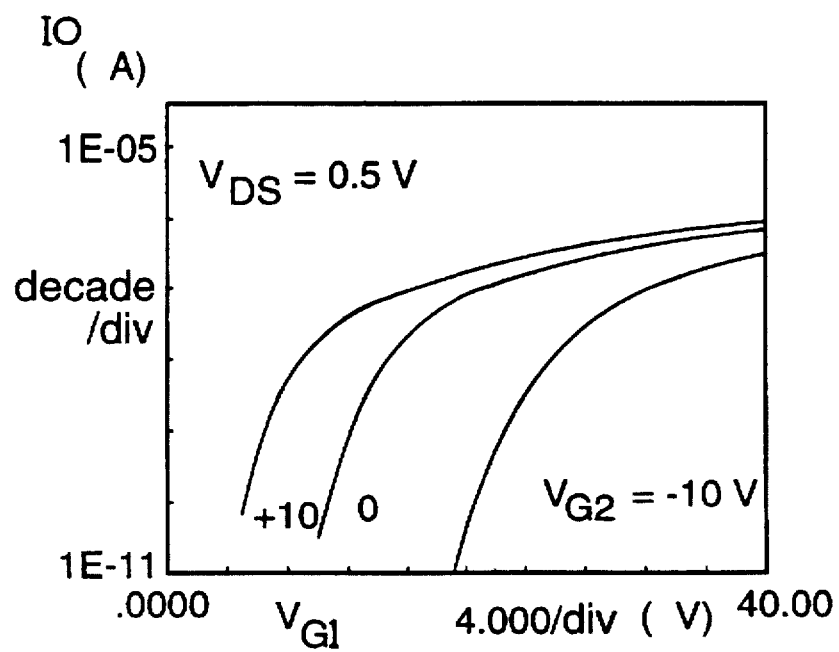
FIG. 6 is a graph showing drain current as a function of one gate voltage with opposite gate voltage as a parameter for a dual gate TFT according to the present invention.

As discussed above, by utilizing dual gate TFTs in the present invention, the threshold voltage measured with respect to one gate (27 or 41) may be altered by changing the bias of the other gate (41 or 27), see for example J-P. Colinge, IEEE Electron Dev. Lett. EDL-6, 573 (1985), and H. K. Lim and J. G. Fossum, IEEE Transactions on Electronic Devices 30, 1244 (1983). This effect is illustrated in FIG. 6, which shows the drain current as a function of one gate voltage, with the other gate voltages as a parameter. The device on which the measurements of FIG. 6 were performed was a CdSe TFT.

As discussed above, with the dual gate structure of the present invention, it is possible to perform measurements with a single ON state voltage of the lower gate 27 voltage, or to sweep the lower gate voltage and utilize the most sensitive bias point for each pixel. By making measurements with more than one ON state value, it is also possible to check the gain of each TFT 13 and digitally compensate for device-to-device variations (this assumes that the rate of change of $I_D$ with the lower gate voltage is related in a simple way to the rate of change of $I_D$ with signal charge).

For the FIG. 3 embodiment of the present invention, the transistor 15 provides protection against the possible buildup of destructive charge on the top gate electrode 41. Even with the lower gate voltage set to a nominally OFF value, the excess charge will eventually turn ON transistors 15, thereby draining the charge and providing a saturation limit. The saturation level depends on the refresh rate and the magnitude of the bottom gate bias used to turn OFF the TFTs 13. CdSe TFTs are particularly flexible in this regard, since their OFF currents maintain a low value over a broad range of negative gate bias (see J. De Baets, Van Calster, J. Capon, I De Rycke, H. De Smet, J. Doutreloinge and J. Vanfleteren, T. Fujisawa, H. Ogawa and H. Takatsu, in Thin Film Transistor Technologies/1992, Y. Kuo, Editor, PV 92-24, page 296, The Electrochemical Society Proceedings Series, Pennington N.J. (1992)). This type of protection is not operative in the embodiments of FIGS. 2 and 4 since portions of the transistor channel near the contacts are either shielded from the top gate by the overhang or source/drain metal or are not covered by the top gate.

Figure 7:
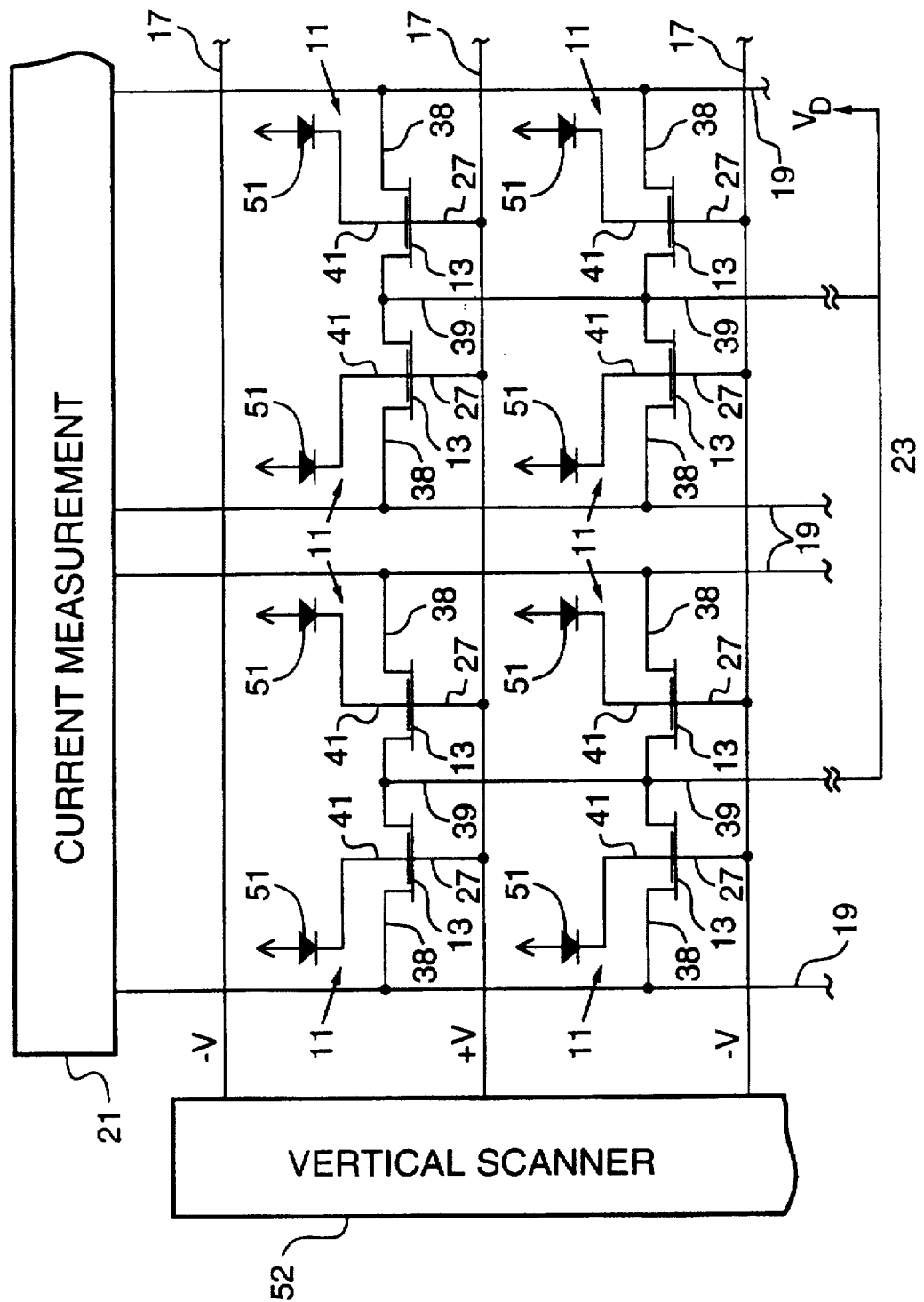
FIG. 7 is a circuit diagram of an imaging device without clearing transistor, according to a further alternative embodiment.

Turning to the alternative embodiment of FIG. 7, the charge dissipation transistors 15 have been eliminated. One approach to fabrication of the device embodiment of FIG. 7 is to eliminate the step of etching the insulator vias through insulating layers 37 in FIGS. 2 and 3 so that there is no electrical connection made between upper gate 41 and transistor 15. In this configuration, the generated charge collected by upper gate 41 is drained by the intrinsic leakage of energy absorbing layer 43. Erasure can be enhanced by re-radiating the device with the top electrode 45 grounded. The embodiment of FIG. 7 is more suitable to capturing still images than for video rate applications.

Figure 8:
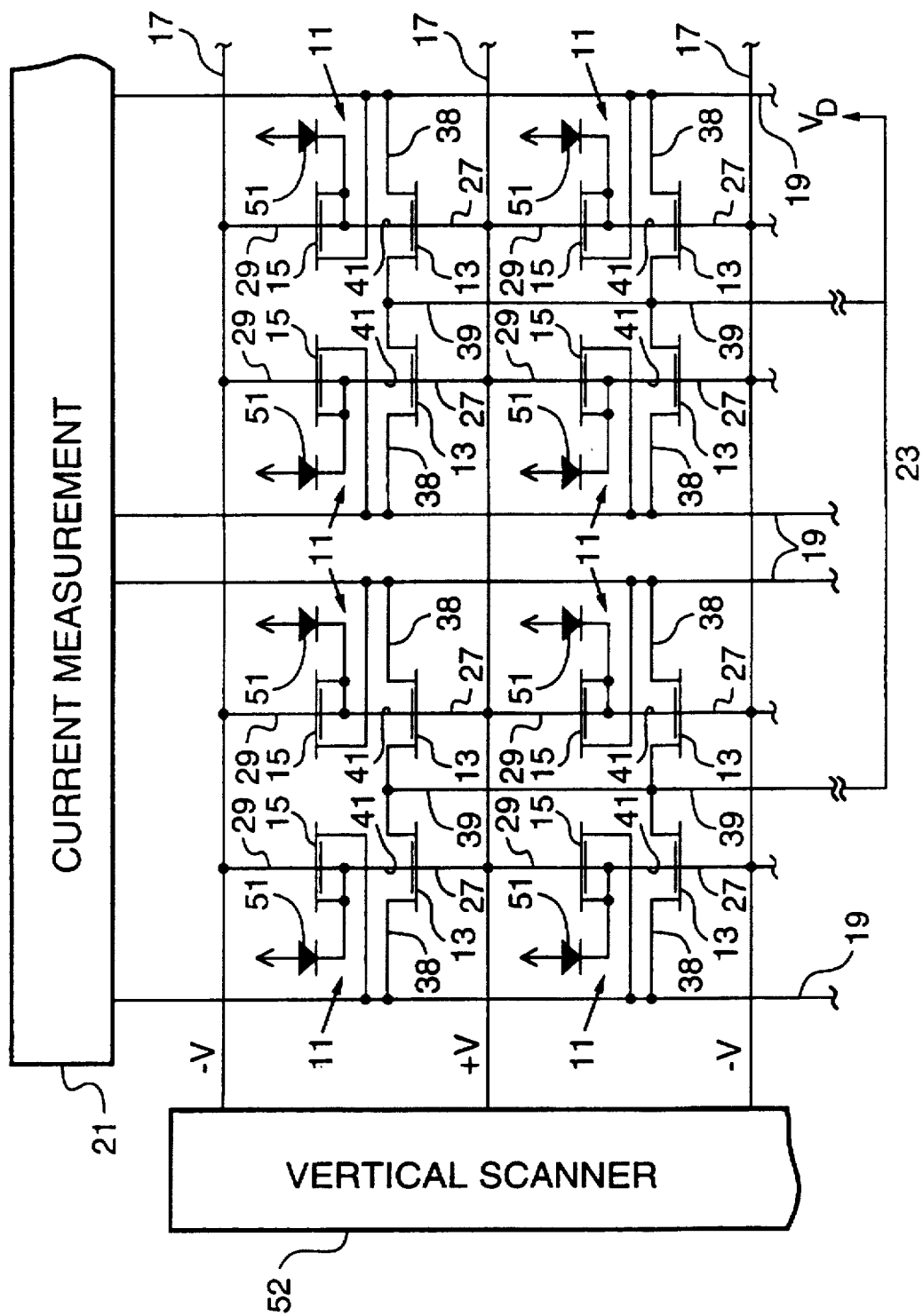
FIG. 8 is a circuit diagram of an imaging device with top gate charge cleared to source lines according to yet another alternative embodiment of the invention.

In the embodiment of FIG. 8, the radiation-generated charge is cleared via transistors 15 to the source lines 19 rather than to the drain lines 39 as in the preferred embodiment of FIG. 1. The measured current of each pixel in the embodiment of FIG. 8 will contain a short transient mode of charge being cleared from the adjacent top gate 41. This transient can be eliminated or ignored by the current measuring circuitry 21 such that only DC current is measured.

In the embodiment of FIGS. 7 and 8 like reference numerals identify the same electrical and structural features discussed above with reference to FIGS. 1–4.

Other embodiments and modifications of the invention are possible. For example, the bottom gate of the transistors 15 can be connected to the source line 19 which can, in turn, be connected to a switch for changing the potential from virtual ground to an ON state value (assuming that the transistors 15 are operating in enhancement mode, i.e. transistors 15 are OFF with $V_G=0$). This allows a given row of pixels to be sensed without clearing the adjacent row. Multiple measurements (with averaging) can then be performed over all of the pixels 11 and the entire image can be cleared subsequently using the aforementioned source line switches.

According to another embodiment, instead of using a common drain for all of the TFT transistors, the drains can be connected to the bottom gate lines or connected to common rows. These modifications require additional mask levels for vias to the bottom gates 27, 29, or for an additional level of metalization. All such modifications and embodiments are believed to be within the sphere and scope of the present invention as defined by the claims appended hereto.

The embodiments of the invention in which an exclusive property of privilege is claimed are defined as follows:

1. An electromagnetic radiation imaging device comprising:
   a) a substrate;
   b) a first plurality of thin film transistors deposited on said substrate, each one of said transistors having a semiconductor channel, a lower gate electrode underlying said semiconductor channel for periodically enabling a respective row of said transistors, an upper gate electrode overlying said semiconductor channel for regulating current flowing through said semiconductor channel when said respective row of said transistors is enabled, a drain electrode and a source electrode, each said drain electrode of said plurality of thin film transistors being interconnected to form an output line, and each said source electrode of said plurality of thin film transistors being interconnected to form a data line;
   c) an energy absorbing layer overlying said plurality of thin film transistors for generating charge in response to being exposed to electromagnetic radiation;
   d) a top electrode connected to a source of potential, said top electrode overlying said energy absorbing layer such that a potential difference causes said charge to be collected on each upper gate electrode thereby regulating said current flowing through each semiconductor channel in proportion to intensity of said electromagnetic radiation;

e) means connected to each said data line for measuring said current and thereby detecting said intensity of electromagnetic radiation; and f) a second plurality of thin film transistors adjacent respective ones of said first plurality of thin film transistors and sharing said upper gate electrodes therewith for discharging said charge collected on said upper gate electrodes after said respective ones of said first plurality of thin film transistors has been enabled.

2. The electromagnetic radiation imaging device of claim 1, wherein each lower gate electrode and each semiconductor channel are separated by a first dielectric layer and each upper gate electrode and each semiconductor channel are separated by a second dielectric layer.

3. The electromagnetic radiation imaging device of claim 2, wherein said source and drain electrodes are deposited on said first dielectric layer for contacting each semiconductor channel at the bottom thereof.

4. The electromagnetic radiation imaging device of claim 2, including a further dielectric layer intermediate said first and second dielectric layers, and wherein said source and drain electrodes are deposited on said further dielectric layer for contacting each semiconductor channel at the top thereof.

5. The electromagnetic radiation imaging device of claim 1, wherein said energy absorbing layer is fabricated from selenium for detecting x-rays.

6. The electromagnetic radiation imaging device of claim 1, wherein said energy absorbing layer is fabricated from an amorphous silicon PIN stack for detecting visible light.

7. The electromagnetic radiation imaging device of claim 1, wherein each of said electrodes is fabricated from metal material.

8. The electromagnetic radiation imaging device of claim 1, wherein one of said electrodes is fabricated from indium tin oxide.

9. The electromagnetic radiation imaging device of claim 1, wherein said first and second plurality of thin film transistors are fabricated from one of amorphous silicon, polycrystaline silicon or cadmium selenide.

10. An electromagnetic radiation imaging device comprising:

a) a substrate;

b) a first plurality of thin film transistors deposited on said substrate, each one of said transistors having a first semiconductor channel, a first lower gate electrode underlying said first semiconductor channel for periodically enabling a respective row of said transistors, an upper gate electrode overlying said first semiconductor channel for regulating current flowing through said semiconductor channel when said respective row of said transistors is enabled, a first drain electrode and a first source electrode, each said first drain electrode of said first plurality of thin film transistors being interconnected to form an output line, and each said first source electrode of said first plurality of thin film transistors being interconnected to form a data line;

c) a second plurality of thin film transistors, each one of said second plurality of transistors having a further semiconductor channel underlying said upper gate electrode such that said upper gate electrode of respective ones of said first plurality and said second plurality of thin film transistors is shared, a further lower gate electrode underlying said further semiconductor channel for periodically enabling a respective row of said second plurality of thin film transistors, a further source electrode connected to said upper gate electrode and a further drain electrode connected to said output line, for discharging charge collected on said upper gate electrode after said respective rows of said plurality of thin film transistors have been enabled;

d) an energy absorbing layer overlying said first plurality and said second plurality of thin film transistors for generating charge in response to being exposed to electromagnetic radiation;

e) a top electrode connected to a source of potential, said top electrode overlying said energy absorbing layer such that a potential difference causes said charge to be collected on said upper gate electrode thereby regulating said current flowing through said first semiconductor channel in proportion to intensity of said electromagnetic radiation; and f) means connected to each said data line for measuring said current and thereby detecting said intensity of electromagnetic radiation.

11. The electromagnetic radiation imaging device of claim 10, wherein said first and further lower gate electrodes and said first and further semiconductor channels are separated by a first dielectric layer and said upper gate electrode and said first and further semiconductor channels are separated by a second dielectric layer.

12. The electromagnetic radiation imaging device of claim 11, wherein said first and said further source and drain electrodes are deposited on said first dielectric layer for contacting said first and said further semiconductor channels, respectively, at the bottom thereof.

13. The electromagnetic radiation imaging device of claim 11, including a further dielectric layer intermediate said first and second dielectric layers, and wherein said first and said further source and drain electrodes are deposited on said further dielectric layer for contacting said first and said further semiconductor channels, respectively, at the top thereof.

* * * * *